United States Patent
Choi

(10) Patent No.: US 9,947,385 B1
(45) Date of Patent: Apr. 17, 2018

(54) DATA SENSE AMPLIFICATION CIRCUIT AND SEMICONDUCTOR MEMORY DEVICE INCLUDING THE SAME

(71) Applicant: SK hynix Inc., Gyeonggi-do (KR)

(72) Inventor: Hae-Rang Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/589,056

(22) Filed: May 8, 2017

(30) Foreign Application Priority Data

Oct. 18, 2016 (KR) .................... 10-2016-0135022

(51) Int. Cl.
| G11C 11/4091 | (2006.01) |
| G11C 11/4074 | (2006.01) |
| G11C 11/4076 | (2006.01) |
| G11C 11/4094 | (2006.01) |
| G11C 7/06 | (2006.01) |

(52) U.S. Cl.
CPC ...... *G11C 11/4091* (2013.01); *G11C 11/4074* (2013.01); *G11C 11/4076* (2013.01); *G11C 11/4094* (2013.01); *G11C 7/06* (2013.01)

(58) Field of Classification Search
CPC .............................. G11C 11/4091; G11C 7/06
USPC ......................................................... 365/205
See application file for complete search history.

(56) References Cited

U.S. PATENT DOCUMENTS

| 7,719,910 B2 | 5/2010 | Vernet et al. |
| 2005/0219925 A1* | 10/2005 | Rho ........................ G11C 7/065 365/205 |

FOREIGN PATENT DOCUMENTS

KR    1020050023537    3/2005

* cited by examiner

*Primary Examiner* — Jason Lappas
(74) *Attorney, Agent, or Firm* — IP & T Group LLP

(57) ABSTRACT

A semiconductor memory device includes: a first memory cell coupled to a first bit line; a second memory cell coupled to a second bit line; and a sense amplification circuit for sensing and amplifying a voltage difference between the first and second bit lines, wherein the sense amplification circuit includes: a first sense amplifier including a cross-coupled pair of first and second transistors coupled to the first bit line and the second bit line, respectively; a second sense amplifier including a cross-coupled pair of third and fourth transistors coupled to the first and second bit lines, respectively; and an offset supplier for controlling a timing for supplying a voltage of the first bit line to the first transistor and a timing for supplying a voltage of the second bit line to the second transistor according to a selected memory from the first and second memory cells.

20 Claims, 9 Drawing Sheets

DATA SENSE AMPLIFICATION CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2016-0135022, filed on Oct. 18, 2016, which is incorporated herein by reference in its entirety.

BACKGROUND

1. Field

Exemplary embodiments of the present invention relate to a semiconductor designing technology and, more particularly, to a semiconductor memory device including a bit line sense amplifier, and a method for operating the semiconductor memory device.

2. Description of the Related Art

A semiconductor memory device is a semiconductor device capable of storing a plurality of data in a plurality of unit cells. A dynamic random access memory (DRAM) device is a memory device capable of storing data by accumulating charges in a capacitor. In the DRAM device, a unit cell typically includes a capacitor and a switch implemented with metal-oxide-semiconductor (MOS) transistors.

As semiconductor technology progresses, memory devices are developed that are more highly integrated. In particular, to highly integrate a DRAM device, it is required to reduce the area of a cell block which is formed of a plurality of unit cells that occupies most of the area.

To this end, a capacitor included in a unit cell of a DRAM device is formed to accumulate a minimal amount of charges that is sufficient to retain a data. For this reason, the amount of charges stored in a capacitor is very small. Therefore, when a signal retaining the data stored in a unit cell is outputted to the outside, the signal has to be amplified in a bit line sense amplifier before the signal is outputted.

FIG. 1 illustrates a structure of a general semiconductor memory device 10.

Referring to FIG. 1, the semiconductor memory device 10 may include a plurality of cell mats 12 and 14 and a plurality of amplifiers 16 to 18.

The cell mats 12 and 14 may be divided into an upper cell mat 12 and a lower cell mat 14 based on the amplifiers 16 and 18. Each of the upper cell mat 12 and the lower cell mat 14 may include a plurality of memory cells MC that are coupled between a plurality of word lines WL and a plurality of bit lines BL and BLB.

Each of the amplifiers 16 to 18 may include a plurality of bit line sense amplifiers BLSA. The bit line sense amplifiers BLSA may be coupled to the bit lines BL of the upper cell mat 12 and the bit lines BLB of the lower cell mat 14 and sense and amplify the data of a memory cell MC that is coupled to an activated word line WL.

FIG. 2 is a circuit diagram illustrating a bit line sense amplifier BLSA shown in FIG. 1 and peripheral structures thereof.

Referring to FIG. 2, the bit line sense amplifier BLSA may be coupled to a bit line BL and a bit line bar BLB. At a cross point between the bit line BL and a word line WL, a memory cell MC including a cell transistor M0 and a cell capacitor C0 may be positioned. Although not illustrated in FIG. 2, memory cells MC may be positioned at the cross points between the bit line bar BLB and word lines (not shown).

Each of the bit line sense amplifiers BLSA may include cross-coupled inverters INV1 and INV2 that operate with driving voltages supplied through a pull-up power source line RTO and a pull-down power source line SB. Also, each of the bit line sense amplifiers BLSA may include a precharger 20 for equally precharging the bit line BL and the bit line bar BLB with a precharge voltage VBLP in a section where an equalizing signal BLEQ is enabled.

Each of the bit line sense amplifiers BLSA may operate as follows.

First of all, when the equalizing signal BLEQ is enabled, the precharger 20 may equally precharge the bit line BL and the bit line bar BLB with the precharge voltage VBLP. This may be referred to as 'a bit line precharge operation', hereafter. Herein, a core voltage VCORE and the precharge voltage VBLP may be internal voltages that are generated internally by using an external power source voltage VDD, which is supplied from the outside of the semiconductor memory device 10. For example, the core voltage VCORE may have a voltage level lower than the power source voltage VDD, and the core voltage VCORE may be usually used as a voltage corresponding to a logic high level of a data that is stored in a memory cell MC. Also, the precharge voltage VBLP may be generated by lowering the core voltage VCORE. The precharge voltage VBLP may be set up as a half of the core voltage VCORE (i.e., VBLP=½*VCORE).

Subsequently, when a word line WL is activated and a memory cell MC is selected, the cell transistor M0 may be turned on, and charge sharing may occur between the bit line BL and the cell capacitor C0. Due to the charge sharing, a potential difference ΔV may be caused between the bit line BL and the bit line bar BLB, and the bit line sense amplifier BLSA may sense and amplify the potential difference ΔV between the bit line BL and the bit line bar BLB by using the driving voltages that are supplied through the pull-up power source line RTO and the pull-down power source line SB. Hereafter, this operation may be referred to as 'a bit line sense and amplification operation.'

A conventional bit line sense amplifier BLSA uses a ½ CORE precharge scheme in which the bit line BL and the bit line bar BLB are precharged with a precharge voltage VBLP which is a half the core voltage VCORE (i.e., VBLP=½*VCORE). However, the bit line sense amplifier BLSA has to make the bit line BL and the bit line bar BLB swing between the core voltage VCORE and a ground voltage VSS, or vice versa, based on the data stored in a memory cell MC, which is the capacitance Cs of the cell capacitor C0 of the memory cell MC, in the process of performing the bit line sense and amplification operation after a bit line precharge operation. Since all the bit line BL and the bit line bar BLB have to be precharged with the precharge voltage VBLP during the bit line precharge operation and both of the bit line BL and the bit line bar BLB have to swing during the bit line sense and amplification operation, more power is consumed.

Meanwhile, as the fabrication process makes progress, in other words, as scaling proceeds, the capacitance Cs of the cell capacitor C0 is decreased, and a bit line capacitance Cb is increased, which leads to a shortened refresh cycle of a memory cell. Therefore, it is required to develop a technology for improving refresh characteristics by increasing the capacitance Cs of the cell capacitor C0, decreasing the bit line capacitance Cb, or reducing the amount of power that is consumed for the bit line precharge operation and the bit line sense and amplification operation.

Accordingly, a method for reducing the amount of power that is consumed for a bit line precharge operation and a bit line sense and amplification operation is required.

SUMMARY

Embodiments of the present invention are directed to a method for improving refresh characteristics by reducing the amount of power that is consumed for a bit line precharge operation and a bit line sense and amplification operation.

Embodiments of the present invention are directed to a semiconductor memory device having a ground bit line precharge scheme.

In accordance with an embodiment of the present invention, a semiconductor memory device includes: a first memory cell coupled to a first bit line; a second memory cell coupled to a second bit line; and a sense amplification circuit suitable for sensing and amplifying a voltage difference between the first bit line and the second bit line, wherein the sense amplification circuit includes: a first sense amplifier including a cross-coupled pair of first and second transistors coupled to the first bit line and the second bit line, respectively; a second sense amplifier including a cross-coupled pair of third and fourth transistors coupled to the first bit line and the second bit line, respectively; and an offset supplier suitable for controlling a timing for supplying a voltage of the first bit line to the first transistor and a timing for supplying a voltage of the second bit line to the second transistor according to a selected memory from the first memory cell and the second memory cell, wherein the first and second transistors include a first type transistor, and the third and fourth transistors include a second type transistor.

In accordance with another embodiment of the present invention, a semiconductor memory device includes: a plurality of cell mats, each of the plurality of cell mats including a plurality of memory cells coupled between a plurality of word lines and bit lines; a plurality of amplifiers disposed between neighboring cell mats among the plurality of the cell mats, each of the plurality of amplifiers including a plurality of sense amplification circuits, wherein each of the sense amplification circuits senses and amplifies a voltage difference between a first bit line of an upper cell mat and a second bit line of a lower cell mat among the neighboring cell mats; and an offset controller suitable for generating first and second offset selection signals corresponding to the plurality of the amplifiers, in response to a plurality of mat enable signals, and deciding an order that the first offset selection signal and the second offset selection signal are enabled based on a sense amplification enable signal, wherein each of the plurality of the sense amplification circuits includes: a first sense amplifier including a cross-coupled pair of first and second transistors coupled to the first bit line and the second bit line, respectively, through a second end and coupled to a first power source line through a first end; a second sense amplifier including a cross-coupled pair of third and fourth transistors coupled to the first bit line and the second bit line, respectively, through a second end and coupled to a first power source line through a first end; and an offset supplier suitable for controlling a timing for supplying a voltage of the first bit line to the first NMOS transistor and a timing for supplying a voltage of the second bit line to the second NMOS transistor in response to an assigned one of the first and second offset selection signals, wherein the first and second transistors include a first type transistor, and the third and fourth transistors include a second type transistor.

In accordance with yet another embodiment of the present invention, a data sense amplification circuit that is coupled between first and second power source voltage terminals to sense and amplify a voltage difference between a first data line which transfers a data outputted from a first region and a second data line which transfers a data outputted from a second region, includes: a first transistor coupled between the first power source voltage terminal and the first data line, having a gate receiving a signal of the second data line; a second transistor coupled between the first power source voltage terminal and the second data line, having a gate receiving a signal of the first data line; a third transistor coupled between the second power source voltage terminal and a first node, having a gate receiving a signal of the second data line; a fourth transistor coupled between the second power source voltage terminal and a second node, having a gate receiving a signal of the first data line; and an offset supplier suitable for controlling a timing for supplying a voltage of the first data line to the first node and a timing for supplying a voltage of the second data line to the second node according to a selected region from the first region and the second region.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
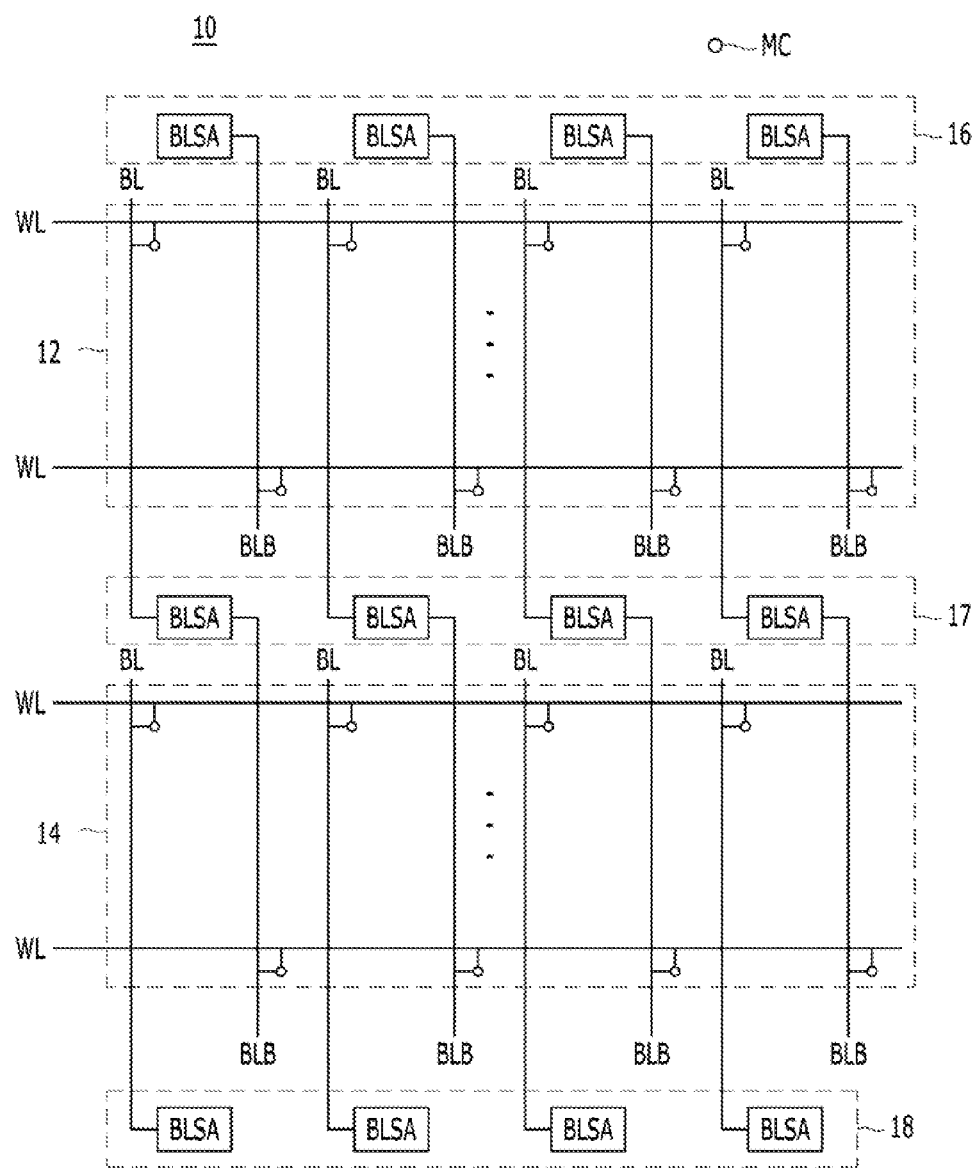
FIG. 1 illustrates a structure of a general semiconductor memory device.
Figure 2:
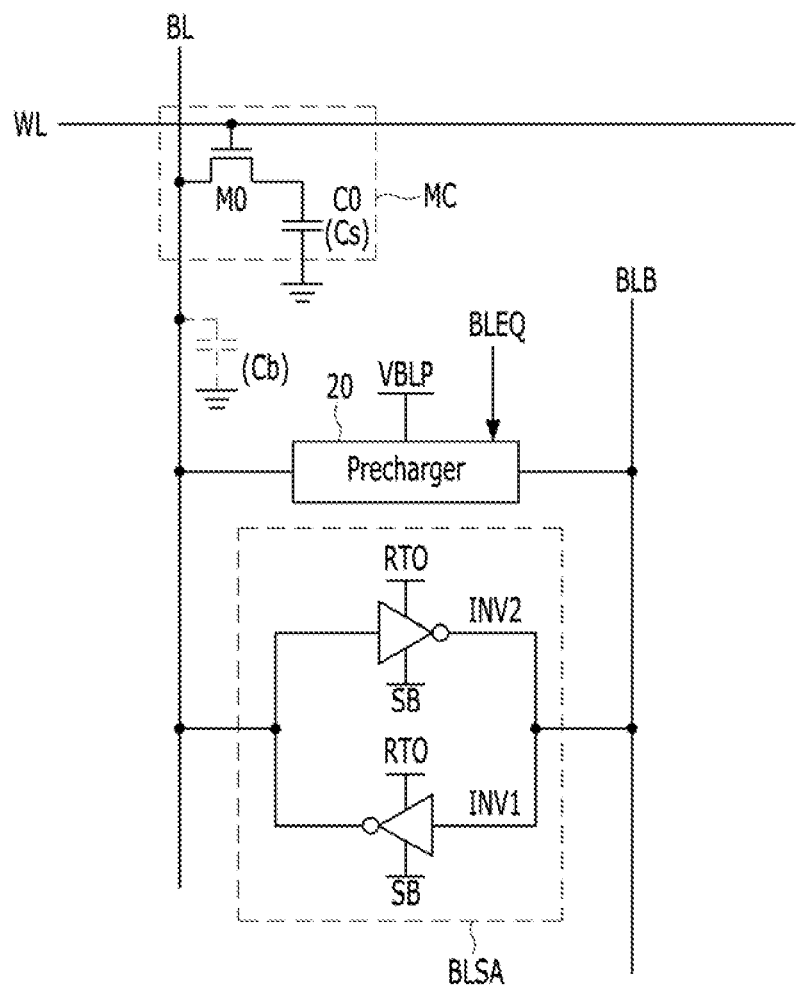
FIG. 2 is a circuit diagram illustrating a bit line sense amplifier shown in FIG. 1 and peripheral structures thereof.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
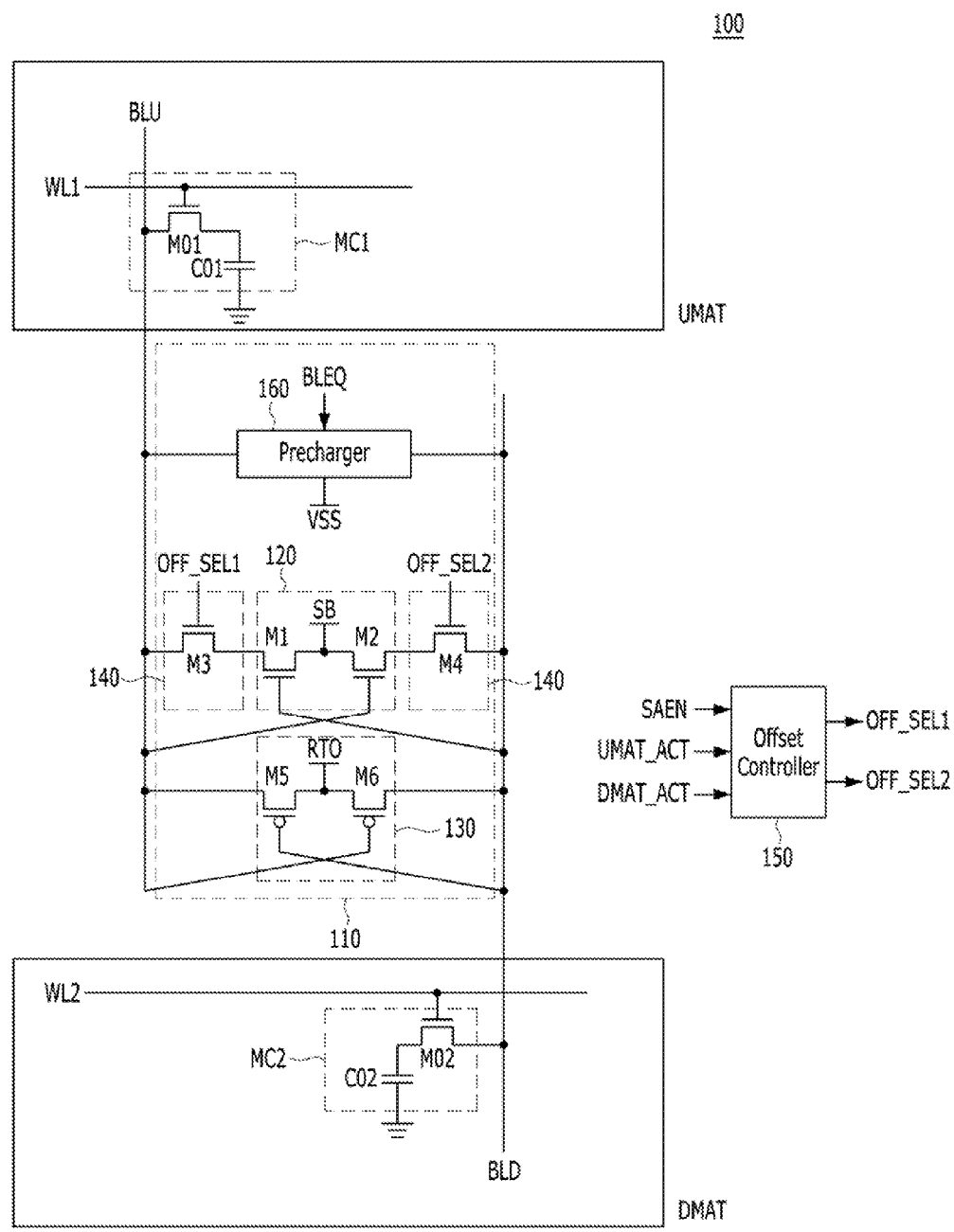
FIG. 3 is a circuit diagram illustrating a semiconductor memory device in accordance with an embodiment of the present invention.

FIG. 3 is a circuit diagram illustrating a semiconductor memory device 100 in accordance with an embodiment of the present invention.

Referring to FIG. 3, the semiconductor memory device 100 may include a first memory cell MC1, a second memory cell MC2 and a bit line sense amplification circuit 110. The first memory cell MC1 is coupled between a first word line WL1 and a first bit line BLU (or a bit line BL), and the second memory cell MC2 is coupled between a second word line WL2 and a second bit line BLD (or a bit line bar BLB). The bit line sense amplification circuit 110 senses and amplifies a voltage difference between the first bit line BLU and the second bit line BLD.

The first memory cell MC1 may include a cell transistor M01 and a cell capacitor C01 that are positioned at a cross point between the first word line WL1 and the first bit line BLU. The second memory cell MC2 may include a cell transistor M02 and a cell capacitor C02 that are positioned at a cross point between the second word line WL2 and the second bit line BLD. According to an embodiment of the present invention, the first memory cell MC1 may be positioned in an upper cell mat UMAT, and the second memory cell MC2 may be positioned in a lower cell mat DMAT. The bit line sense amplification circuit 110 may be positioned between the upper cell mat UMAT and the lower cell mat DMAT to sense and amplify the voltage difference between the first bit line BLU and the second bit line BLD.

The bit line sense amplification circuit 110 may include an N-type sense amplifier 120, a P-type sense amplifier 130, and an offset supplier 140.

The N-type sense amplifier 120 may include a pair of a first NMOS transistor M1 and a second NMOS transistor M2 that are cross-coupled to each other and respectively coupled to the first bit line BLU and the second bit line BLD. The P-type sense amplifier 130 may include a pair of a first PMOS transistor M5 and a second PMOS transistor M6 that are cross-coupled to each other and respectively coupled to the first bit line BLU and the second bit line BLD. The offset supplier 140 may control a timing for supplying a voltage of the first bit line BLU to the first NMOS transistor M1 and a timing for supplying a voltage of the second bit line BLD to the second NMOS transistor M2 according to a memory cell that is selected between the first memory cell MC1 and the second memory cell MC2.

Each of the first PMOS transistor M5 and the second PMOS transistor M6 may include a first end coupled to a pull-up power source line RTO, a second end coupled to one selected between the first bit line BLU and the second bit line BLD, and a gate receiving a voltage of the other one between the first bit line BLU and the second bit line BLD. Each of the first NMOS transistor M1 and the second NMOS transistor M2 include a first end coupled to a pull-down power source line SB. A second end of the M1 transistor is coupled to the first bit line BLU via the offset supplier 140. Also, second end of the M2 transistor is coupled to the second bit line BLD via the offset supplier 140. The gate of each of the M1 and M2 transistors is receiving a voltage of the other one between the first bit line BLU and the second bit line BLD. In accordance with the illustrated embodiment of the present invention, the second ends of the first NMOS transistor M1 and the second NMOS transistor M2 are not directly coupled to the first bit line BLU and the second bit line BLD, but they are coupled to the first bit line BLU and the second bit line BLD through the offset supplier 140.

When the first memory cell MC1 is selected, the offset supplier 140 may supply the voltage of the first bit line BLU to the first NMOS transistor M1 and then supply the voltage of the second bit line BLD to the second NMOS transistor M2. Also, when the second memory cell MC2 is selected, the offset supplier 140 may supply the voltage of the second bit line BLD to the second NMOS transistor M2 and then supply the voltage of the first bit line BLU to the first NMOS transistor M1. According to an embodiment of the present invention, when the first memory cell MC1 is selected, the offset supplier 140 may supply the voltage of the first bit line BLU to the first NMOS transistor M1. Then, after a sense amplification enable signal SAEN is enabled (that is, after a pull-up driving voltage and a pull-down driving voltage are supplied to the pull-up power source line RTO and the pull-down power source line SB), the offset supplier 140 may supply the voltage of the second bit line BLD to the second NMOS transistor M2. Also, when the second memory cell MC2 is selected, the offset supplier 140 may supply the voltage of the second bit line BLD to the second NMOS transistor M2. Then, after the sense amplification enable signal SAEN is enabled, the offset supplier 140 may supply the voltage of the first bit line BLU to the first NMOS transistor M1.

The semiconductor memory device 100 may further include an offset controller 150.

Figure 4:
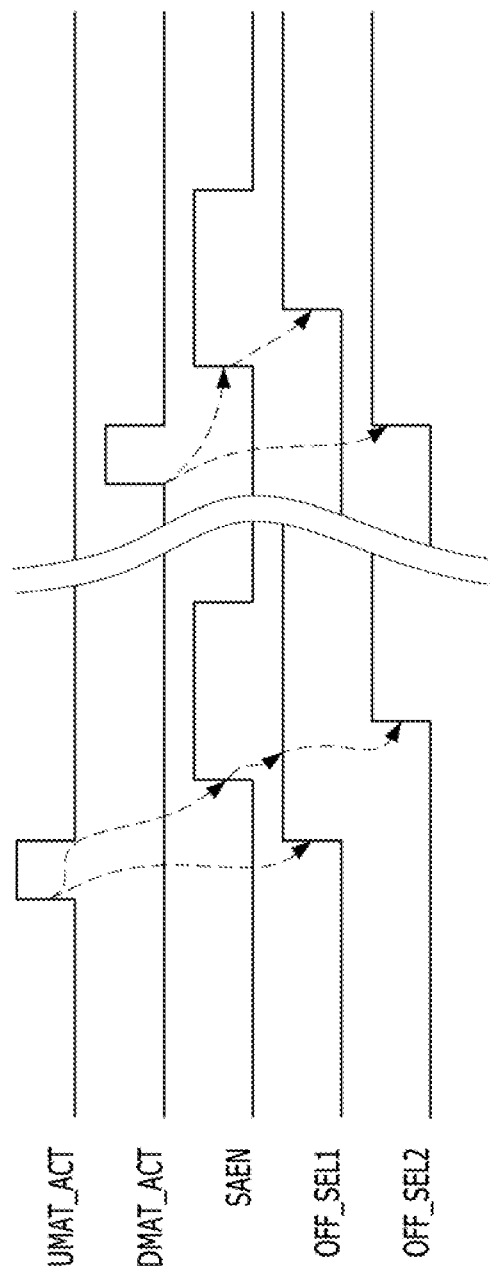
FIG. 4 is a timing diagram illustrating an operation of an offset controller shown in FIG. 3.

FIG. 4 is a timing diagram illustrating an operation of the offset controller 150 shown in FIG. 3.

Referring to FIG. 4, when an upper mat enable signal UMAT_ACT is enabled, the offset controller 150 may enable a first offset selection signal OFF_SEL1 after a predetermined time. When the sense amplification enable signal SAEN is enabled while the first offset selection signal OFF_SEL1 is enabled, the offset controller 150 may enable a second offset selection signal OFF_SEL2 after a predetermined time.

Also, when a lower mat enable signal DMAT_ACT is enabled, the offset controller 150 may enable the second offset selection signal OFF_SEL2 after a predetermined time. When the sense amplification enable signal SAEN is enabled while the second offset selection signal OFF_SEL2 is enabled, the offset controller 150 may enable the first offset selection signal OFF_SEL1 after a predetermined time.

Referring back to FIG. 3, the offset controller 150 may generate the first offset selection signal OFF_SEL1 and the second offset selection signal OFF_SEL2 in response to the upper mat enable signal UMAT_ACT and the lower mat enable signal DMAT_ACT, respectively. The offset controller 150 may decide an order that the first offset selection signal OFF_SEL1 and the second offset selection signal OFF_SEL2 are enabled according to the sense amplification enable signal SAEN.

Herein, the offset supplier 140 may include a first coupler M3 and a second coupler M4. The first coupler M4 couples the first bit line BLU and the first NMOS transistor M1 in response to the first offset selection signal OFF_SEL1. The second coupler M4 couples the second bit line BLD and the second NMOS transistor M2 in response to the second offset selection signal OFF_SEL2. According to an embodiment of the present invention, each of the first coupler M3 and the second coupler M4 may be formed of a transistor that includes a first end coupled to the first bit line BLU or the second bit line BLD, a second end coupled to the first NMOS transistor M1 or the second NMOS transistor M2, and a gate coupled to the first offset selection signal OFF_SEL1 or the second offset selection signal OFF_SEL2.

Meanwhile, the semiconductor memory device 100 may include a precharger 160 for grounding the first and second bit lines BLU and BLD with a ground voltage VSS in a period where an equalizing signal BLEQ is enabled. According to another embodiment of the present invention, the precharger 160 may be omitted.

Figure 5:
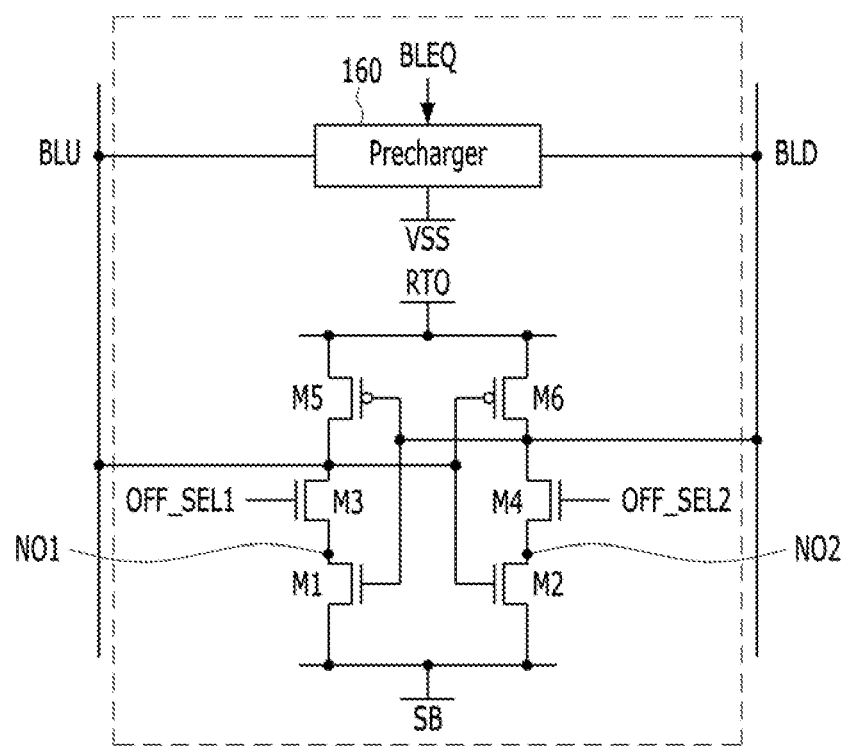
FIG. 5 is a circuit diagram illustrating a bit line sense amplification circuit in accordance with a modified example of the embodiment of the present invention shown in FIG. 3.

FIG. 5 is a circuit diagram illustrating a bit line sense amplification circuit 110A in accordance with a modified example of the embodiment of the present invention shown in FIG. 3.

Herein, although the structure shown in FIG. 5 is substantially the same as the structure shown in FIG. 3, a modified disposition is presented to help understand the description of the embodiment of the present invention. Hereafter, the same constituent elements appearing in FIGS. 3 and 5 are given the same reference numerals, and the same description is provided once.

Referring to FIG. 5, the bit line sense amplification circuit 110A may include first to sixth transistors M1 to M6 and a precharger 160.

The first transistor M1 may be coupled between a pull-down power source line SB and a first node N01, and have a gate receiving a signal of a second bit line BLD. The second transistor M2 may be coupled between the pull-down power source line SB and a second node N02, and have a gate receiving a signal of the first bit line BLU. The third transistor M3 may be coupled between the first bit line BLU and the first node N01, and have a gate receiving a first offset selection signal OFF_SEL1. The fourth transistor M4 may be coupled between the second bit line BLD and the second node N02, and have a gate receiving a second offset selection signal OFF_SEL2. The fifth transistor M5 may be coupled between a pull-up power source line RTO and the first bit line BLU, and have a gate receiving a signal of the second bit line BLD. The sixth transistor M6 may be coupled between the pull-up power source line RTO and the second bit line BLD, and have a gate receiving a signal of the first bit line BLU. Herein, the first transistor M1 and the second transistor M2 may correspond to the N-type sense amplifier 120 shown in FIG. 3, and the third transistor M3 and the fourth transistor M4 may correspond to the offset supplier 140 of FIG. 3. The fifth transistor M5 and the sixth transistor M6 may correspond to the P-type sense amplifier 130 of FIG. 3.

The precharger 160 may ground the first and second bit lines BLU and BLD with the ground voltage VSS in a period where the equalizing signal BLEQ is enabled.

Hereafter, an operation of the semiconductor memory device 100 in accordance with the embodiment of the present invention is described by referring to FIGS. 3 to 7B.

FIGS. 6A to 7B are timing diagrams illustrating an operation of a semiconductor memory device in accordance with an embodiment of the present invention.

Figure 6A:
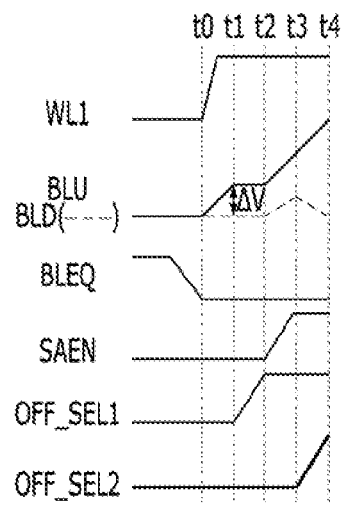
FIGS. 6A to 7B are timing diagrams illustrating an operation of a semiconductor memory device in accordance with an embodiment of the present invention.

More specifically, FIGS. 6A and 68B are timing diagrams illustrating an operation of the semiconductor memory device when a data of a first memory cell MC1 is in a logic high level and when the data of the first memory cell MC1 is in a logic low level, in accordance with the embodiment of the present invention, while the upper cell mat UMAT is enabled.

Referring to FIG. 6A, when the equalizing signal BLEQ is enabled before a time t0, the precharger 160 may ground the first and second bit lines BLU and BLD with the ground voltage VSS.

At the time t0, when the first memory cell MC1 is selected as the upper mat enable signal UMAT_ACT is enabled and the first word line WL1 is enabled, the cell transistor M01 may be turned on, and charge sharing may occur between the first bit line BLU and the cell capacitor C01. Due to the charge sharing, a potential difference ΔV may be caused between the first bit line BLU and the second bit line BLD.

At the time t1, the offset controller 150 may enable the first offset selection signal OFF_SEL1. Herein, since the sense amplification enable signal SAEN is disabled, the pull-up driving voltage and the pull-down driving voltage may not be supplied. Therefore, the potential difference ΔV between the first bit line BLU and the second bit line BLD may be maintained between the time t0 and the time t1.

According to the enabled first offset selection signal OFF_SEL1, the third transistor M3 may be turned on to connect the first bit line BLU and the first node N01 to each other. According to the disabled second offset selection signal OFF_SEL2, the fourth transistor M4 may be turned off to decouple the second bit line BLD and the second node N02 from each other. Also, the charge shared first bit line BLU may turn off the sixth transistor M6, and the second bit line BLD precharged with the ground voltage VSS may turn on the fifth transistor M5.

At a time t2, when the sense amplification enable signal SAEN is enabled, the pull-up driving voltage (e.g., the power source voltage VDD or the core voltage VCORE) and the pull-down driving voltage (e.g., the ground voltage VSS) may be supplied through the pull-up power source line RTO and the pull-down power source line SB. Herein, since the fifth transistor M5 is turned on, the first bit line BLU may be driven with the pull-up driving voltage that is supplied through the pull-up power source line RTO. Meanwhile, since the sixth transistor M6 is decoupled from the second transistor M2 in the initial period (which ranges from the time t2 to the time t3) where the pull-up driving voltage and the pull-down driving voltage are supplied, fighting with the second transistor M2 is not formed. Therefore, the sixth transistor M6 may be partially turned on. With the sixth transistor M6 that is weakly turned on, the second bit line BLD may be driven with the pull-up driving voltage supplied through the pull-up power source line RTO.

At a time t3, the offset controller 150 may enable the second offset selection signal OFF_SEL2, and thus the fourth transistor M4 may be turned on to couple the second bit line BLD and the second node N02 to each other. Therefore, the second bit line BLD may be driven with the pull-down driving voltage that is supplied through the pull-down power source line SB.

At a time t4, the voltage difference between the first bit line BLU and the second bit line BLD may be amplified to normally sense the logic high level data of the first memory cell MC1.

Figure 6B:
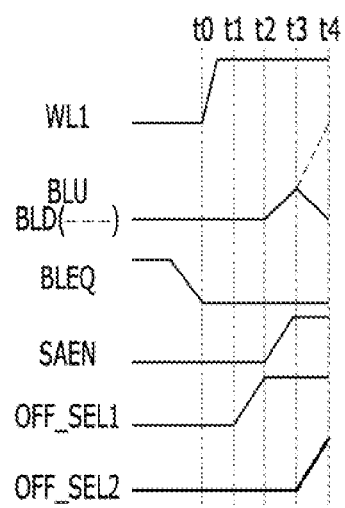

Referring to FIG. 6B, when the equalizing signal BLEQ is enabled before the time t0, the precharger 160 may ground the first and second bit lines BLU and BLD with the ground voltage VSS.

At the time t0, although charge sharing may occur between the first bit line BLU and the cell capacitor C01, since the data of the first memory cell MC1 is a logic low data, there is no potential difference occurring between the first bit line BLU and the second bit line BLD.

At the time t1, the offset controller 150 may enable the first offset selection signal OFF_SEL1. Herein, since the sense amplification enable signal SAEN is disabled, the pull-up driving voltage and the pull-down driving voltage are not supplied.

According to the enabled first offset selection signal OFF_SEL1, the third transistor M3 may be turned on to couple the first bit line BLU and the first node N01. Also, according to the disabled second offset selection signal OFF_SEL2, the fourth transistor M4 may be turned off to decouple the second bit line BLD and the second node N02. Also, the sixth transistor M6 may be turned on by the first bit line BLU sharing charges of a logic low data, and the fifth transistor M5 may be turned on by the second bit line BLD that is precharged with the ground voltage VSS.

At a time t2, when the sense amplification enable signal SAEN is enabled, the pull-up driving voltage and the pull-down driving voltage may be supplied through the pull-up power source line RTO and the pull-down power source line SB. Herein, since the fifth transistor M5 and the sixth transistor M6 are all turned on in the initial period (which ranges from the time t2 to the time t3) where the pull-up driving voltage and the pull-down driving voltage are supplied, the first bit line BLU and the second bit line BLD may be driven with the pull-up driving voltage.

At a time t3, as the pull-up driving voltage is gradually increased, the voltage of the second bit line BLD may be raised together and thereby the first transistor M1 may be turned on. Therefore, the first bit line BLU may be driven with the pull-down driving voltage that is supplied through the pull-down power source line SB. The second bit line BLD may be driven with the pull-up driving voltage that is supplied through the pull-up power source line RTO. Subsequently, the offset controller 150 may enable the second offset selection signal OFF_SEL2, and accordingly, the fourth transistor M4 may be turned on to couple the second bit line BLD and the second node N02 to each other.

At the time t4, the voltage difference between the first bit line BLU and the second bit line BLD may be amplified to normally sense the logic high level data of the first memory cell MC1.

Figure 7A:
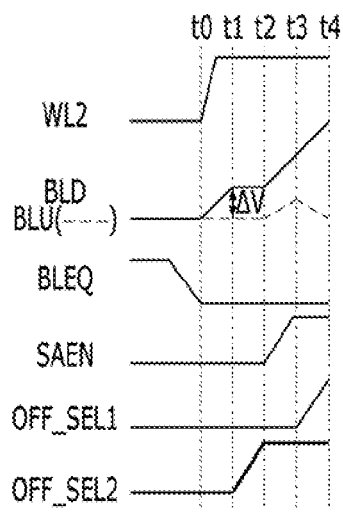
Figure 7B:
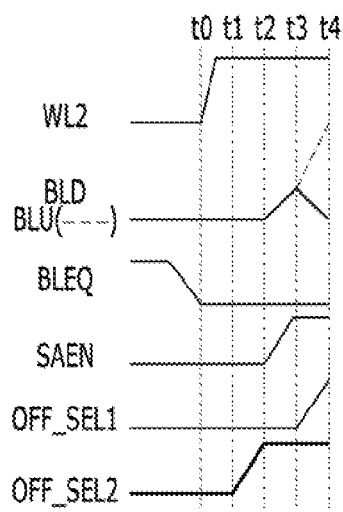

FIGS. 7A and 7B are timing diagrams illustrating an operation of the semiconductor memory device when a data of a second memory cell MC2 is in a logic high level and when the data of the second memory cell MC2 is in a logic low level in accordance with an embodiment of the present invention, while the lower cell mat DMAT is enabled.

Herein, the operation of FIGS. 7A and 7B is substantially the same as the operation of FIGS. 6A and 6B. Herein, when the lower cell mat DMAT is enabled and the second word line WL2 is enabled and thereby the second memory cell MC2 is selected, charge sharing may occur between the second bit line BLD the cell capacitor C02. Further, when the data of the second memory cell MC2 is in a logic high level, the second bit line BLD may be driven with the pull-up driving voltage. Further, when the data of the second memory cell MC2 is in a logic low level, the second bit line BLD may be driven with the pull-down driving voltage. Also, according to the enabled lower mat enable signal DMAT_ACT, the offset controller 150 may enable the second offset selection signal OFF_SEL2. Further, when the sense amplification enable signal SAEN is enabled while the second offset selection signal OFF_SEL2 is enabled, the offset controller 150 may enable the first offset selection signal OFF_SEL1 after a predetermined time.

Figure 8:
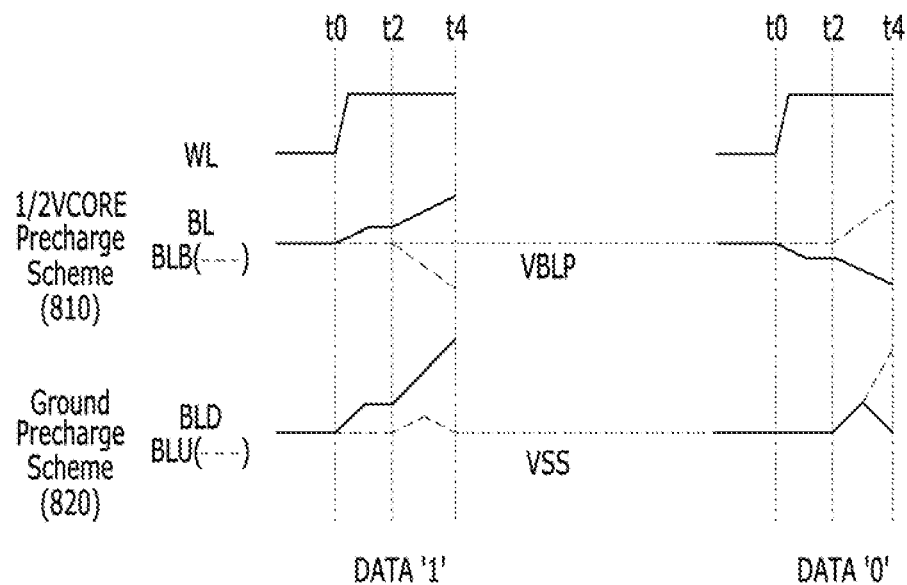
FIG. 8 is a timing diagram illustrating precharge schemes in accordance with the embodiment of the present invention and a comparative example.

FIG. 8 is a timing diagram illustrating a ½ VCORE precharge scheme with a ground precharge scheme in accordance with an embodiment of the present invention.

In FIG. 8, 810 shows the ½ VCORE precharge scheme for sensing and amplifying the data of the bit line BL.

Before the word line WL is enabled ahead of the time t0, the bit line BL and the bit line bar BLB may be equally precharged with the precharge voltage VBLP. At the time t0, when the word line WL is enabled and a memory cell is selected, charge sharing may occur between the cell capacitor of the selected memory cell and the bit line BL. At the time t2, the bit line sense amplifier BLSA may sense and amplify the potential difference between the bit line BL and the bit line bar BLB by using the driving voltages that are supplied through the pull-up power source line RTO and the pull-down power source line SB. Herein, when the data of the memory cell is in a logic high level, the bit line BL and the bit line bar BLB may swing to the core voltage VCORE and the ground voltage VSS. When the data of the memory cell is in a logic low level, the bit line BL and the bit line bar BLB may swing to the ground voltage VSS and the core voltage VCORE. At the time t4, the logic high level data of the memory cell may be normally sensed.

As described above, in the ½ VCORE precharge scheme 810, both of the bit line BL and the bit line bar BLB may be precharged with the precharge voltage VBLP, and since both of the bit line BL and the bit line bar BLB swing in the bit line sense and amplification operation, more power may be consumed.

On the other hand, since the first bit line BLU (or bit line BL) and the second bit line BLD (or bit line bar BLB) are precharged with the ground voltage VSS in the ground precharge scheme 820 in accordance with the embodiment of the present invention, charges may be consumed only when the data of the memory cell is in a logic high level. That is, when the data of the memory cell is in a logic low level, no charges may be consumed. Therefore, during the bit line precharge operation and the bit line sense and amplification operation, power consumption may be reduced and in this way, the refresh cycle may be improved.

The above-described embodiment of the present invention illustrates the bit line sense amplification circuit 110 that may sense and amplify the voltage difference between the first bit line UBL coupled to the first memory cell MC1 positioned in the upper cell mat UMAT and the second bit line DBL coupled to the second memory cell MC2 positioned in the lower cell mat DMAT. However, the concept and spirit of the present invention are not limited to it, and the semiconductor memory device may include a plurality of bit line sense amplifiers BLSA that are disposed between a plurality of cell mats.

Hereafter, a semiconductor memory device including a plurality of bit line sense amplifiers BLSA that are disposed between a plurality of cell mats is described with reference to the accompanying drawings.

Figure 9:
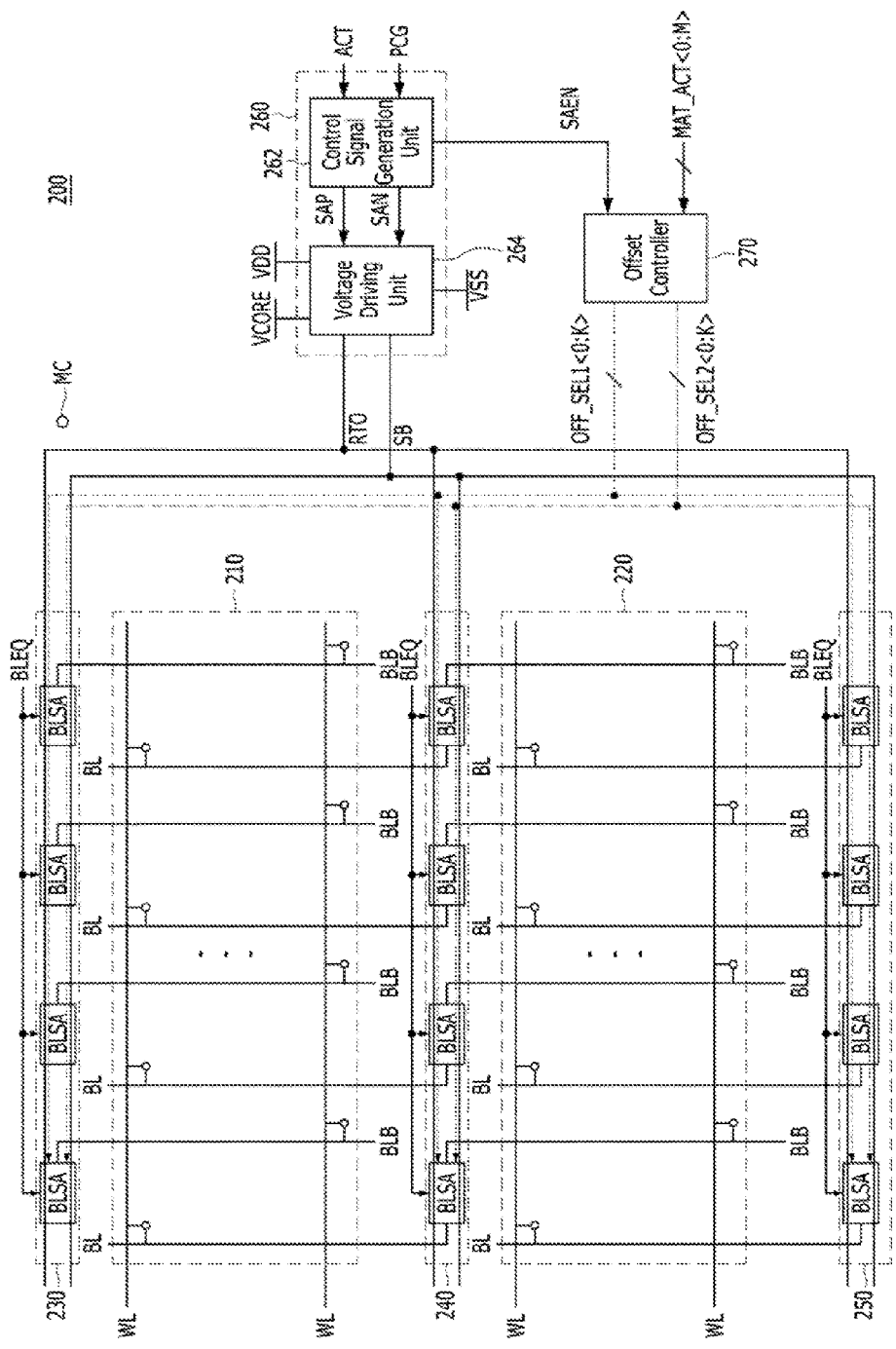
FIG. 9 is a block diagram illustrating a semiconductor memory device in accordance with an embodiment of the present invention.

FIG. 9 is a block diagram illustrating a semiconductor memory device 200 in accordance with an embodiment of the present invention.

Referring to FIG. 9, the semiconductor memory device 200 may include a plurality of cell mats 210 and 220, a plurality of amplifiers 230 to 250, a sense amplifier controller 260, and an offset controller 270.

Two neighboring cell mats among the cell mats 210 and 220 may be divided into an upper cell mat 210 and a lower cell mat 220 based on one amplifier among the amplifiers 230 to 250. Each of the upper cell mat 210 and the lower cell mat 220 may include a plurality of memory cells MC that are coupled between a plurality of word lines WL and a plurality of bit lines BL.

Each of the amplifiers 230 to 250 may include a plurality of bit line sense amplifiers BLSA, which are coupled to the bit lines BL of the upper cell mat 210 and the bit lines BL of the lower cell mat 220 to sense and amplify the data of a memory cell MC that is coupled to an activated word line WL. Each of the bit line sense amplifiers BLSA may correspond to the bit line sense amplification circuit 110 shown in FIG. 3.

The sense amplifier controller 260 may generate a sense amplification enable signal SAEN in response to an active signal ACT and a precharge signal PCG, and may generate a pull-up control signal SAP and a pull-down control signal SAN based on the generated sense amplification enable signal SAEN. Also, the sense amplifier controller 260 may supply a pull-up driving voltage through a pull-up power source line RTO based on the pull-up control signal SAP, and supply a pull-down driving voltage through a pull-down power source line SB based on the pull-down control signal SAN.

To be specific, the sense amplifier controller 260 may include a control signal generation unit 262 and a voltage driving unit 264. The control signal generation unit 262 may generate the sense amplification enable signal SAEN which is enabled in response to the active signal ACT and disabled in response to the precharge signal PCG, and control the enabling timing of the pull-up control signal SAP and the pull-down control signal SAN based on the sense amplification enable signal SAEN. The voltage driving unit 264 may drive the pull-up power source line RTO and the pull-down power source line SB based on the pull-up control signal SAP and the pull-down control signal SAN.

Herein, during an over-driving operation that is performed to shorten the amplification time of the amplifiers 230 to 250, the control signal generation unit 262 may generate a first pull-up control signal SAP1 (not shown) that is enabled in the initial period of the enabling period of the sense amplification enable signal SAEN and a second pull-up control signal SAP2 (not shown) that is enabled in the remaining period of the enabling period of the sense amplification enable signal SAEN. Also, when the sense amplification enable signal SAEN is enabled in the initial period of the operation of the bit line sense amplifiers BLSA, the voltage driving unit 264 may shorten the amplification time of the bit line sense amplifiers BLSA by supplying a voltage (e.g., a power source voltage VDD) with a level higher than a core voltage VCORE through the pull-up power source line RTO based on the first pull-up control signal SAP1.

The offset controller 270 may generate a first offset selection signal OFF_SEL1<0:K> and a second offset selection signal OFF_SEL2<0:K> in response to a mat enabling signal MAT_ACT<0:M>, while deciding the order that the first offset selection signal OFF_SEL1<0:K> and the second offset selection signal OFF_SEL2<0:K> are enabled based on the sense amplification enable signal SAEN. Herein, M and K are positive integers, with M corresponding to the number of the cell mats 210 and 220, and K corresponding to the number of the amplifiers 230 to 250. For example, when there are 8 cell mats and there are 7 amplifiers, M may be '7' and K may be '6'. Since the offset controller 270 corresponds to the offset controller 150 shown in FIG. 3, detailed description on the offset controller 270 is omitted herein.

In FIG. 9, the bit line BL and the bit line bar BLB may be precharged with the ground voltage VSS before the active signal ACT is inputted. When the active signal ACT is received, the bit line sense amplifiers BLSA may begin operating with the pull-up driving voltage and the pull-down driving voltage that are supplied through the pull-up power source line RTO and the pull-down power source line SB from the sense amplifier controller 260. Herein, the offset supplier (e.g., 140 of FIG. 3) inside the bit line sense amplifiers BLSA may control the timing for supplying the voltage of the bit line BL or the voltage of the bit line bar BLB to the first NMOS transistor (e.g., M1 of FIG. 3) and the second NMOS transistor (e.g., M2 of FIG. 3) of the N-type sense amplifier (e.g., 120 of FIG. 3) based on which cell mat between the upper cell mat 210 and the lower cell mat 220 is activated. For example, when the upper cell mat 210 is activated, the offset supplier 140 may supply the voltage of the bit line BL to the first NMOS transistor M1, and after the sense amplification enable signal SAEN is enabled and the pull-up driving voltage and the pull-down driving voltage are supplied through the pull-up power source line RTO and the pull-down power source line SB, the offset supplier 140 may supply the voltage of the bit line bar BLB to the second NMOS transistor M2.

Meanwhile, although the bit line sense amplifiers for sensing and amplifying the voltage difference between the bit lines is taken as an example and described in the embodiment of the present invention, the technological features of the present invention are not limited to it. For example, the bit line sense amplification circuits 110 and 110A shown in FIGS. 3 and 4 may be coupled between a first power source voltage terminal and a second power source voltage terminal, and applied to a data sense amplification circuit that senses and amplifies the voltage difference between a first data line for transferring a data outputted from a first region and a second data line for transferring a data outputted from a second region.

According to an embodiment of the present invention, a semiconductor memory device may reduce the amount of power that is consumed for a bit line precharge operation and a bit line sense and amplification operation by using a ground bit line precharge scheme.

In this way, the semiconductor memory device in accordance with the embodiment of the present invention may improve a refresh cycle.

While the present invention has been described with respect to the specific embodiments, it will be apparent to those skilled in the art that various changes and modifications may be made without departing from the spirit and scope of the invention as defined in the following claims.

For example, the position and kind of a logical gate and a transistor exemplified in the above-described embodiments may be realized differently according to the polarity of an input signal.

What is claimed is:

1. A semiconductor memory device comprising:
   a first memory cell coupled to a first bit line;
   a second memory cell coupled to a second bit line; and
   a sense amplification circuit suitable for sensing and amplifying a voltage difference between the first bit line and the second bit line,
   wherein the sense amplification circuit includes:
      a first sense amplifier including a cross-coupled pair of first and second transistors coupled to the first bit line and the second bit line, respectively;
      a second sense amplifier including a cross-coupled pair of third and fourth transistors coupled to the first bit line and the second bit line, respectively; and
      an offset supplier suitable for controlling a timing for supplying a voltage of the first bit line to the first transistor and a timing for supplying a voltage of the second bit line to the second transistor according to a selected memory from the first memory cell and the second memory cell,
   wherein the first and second transistors include a first type transistor, and the third and fourth transistors include a second type transistor.

2. The semiconductor memory device of claim 1, wherein when the first memory cell is selected, the offset supplier supplies the voltage of the first bit line to the first transistor and then supplies the voltage of the second bit line to the second transistor.

3. The semiconductor memory device of claim 1, wherein when the second memory cell is selected, the offset supplier supplies the voltage of the second bit line to the second transistor and then supplies the voltage of the first bit line to the first transistor.

4. The semiconductor memory device of claim 1, wherein when the first memory cell is selected, the offset supplier supplies the voltage of the first bit line to the first transistor and then after a sense amplification enable signal is enabled, supplies the voltage of the second bit line to the second transistor.

5. The semiconductor memory device of claim 1, wherein when the second memory cell is selected, the offset supplier supplies the voltage of the second bit line to the second transistor and then after a sense amplification enable signal is enabled, the offset supplier supplies the voltage of the first bit line to the first transistor.

6. The semiconductor memory device of claim 1, further comprising:
   an offset controller suitable for generating a first offset selection signal and a second offset selection signal in response to an enable signal for a first mat where the first memory cell is positioned and an enable signal for a second mat where the second memory cell is positioned, and deciding an order that the first offset selection signal and the second offset selection signal are enabled.

7. The semiconductor memory device of claim 6, wherein the offset supplier includes:
   a first coupler suitable for coupling the first bit line and the first transistor to each other in response to the first offset selection signal; and
   a second coupler suitable for coupling the second bit line and the second transistor to each other in response to the second offset selection signal.

8. The semiconductor memory device of claim 6, wherein when the enable signal of the first cell mat is enabled, the offset controller enables the first offset selection signal, and when the sense amplification enable signal is enabled while the first offset selection signal is enabled, the offset controller enables the second offset selection signal, and
   when the enable signal of the second cell mat is enabled, the offset controller enables the second offset selection signal, and when the sense amplification enable signal is enabled while the second offset selection signal is enabled, the offset controller enables the first offset selection signal.

9. The semiconductor memory device of claim 6, wherein when an equalizing signal is enabled, the sense amplification circuit further includes:
   a precharger suitable for grounding the first bit line and the second bit line with a ground voltage.

10. A semiconductor memory device comprising:
    a plurality of cell mats, each of the plurality of cell mats including a plurality of memory cells coupled between a plurality of word lines and bit lines;
    a plurality of amplifiers disposed between neighboring cell mats among the plurality of the cell mats, each of the plurality of amplifiers including a plurality of sense amplification circuits, wherein each of the sense amplification circuits senses and amplifies a voltage difference between a first bit line of an upper cell mat and a second bit line of a lower cell mat among the neighboring cell mats; and
    an offset controller suitable for generating first and second offset selection signals corresponding to the plurality of the amplifiers, in response to a plurality of mat enable signals, and deciding an order that the first offset selection signal and the second offset selection signal are enabled based on a sense amplification enable signal,
    wherein each of the plurality of the sense amplification circuits includes:
       a first sense amplifier including a cross-coupled pair of first and second transistors coupled to the first bit line and the second bit line, respectively, through a second end and coupled to a first power source line through a first end;
       a second sense amplifier including a cross-coupled pair of third and fourth transistors coupled to the first bit line and the second bit line, respectively, through a second end and coupled to a first power source line through a first end; and
       an offset supplier suitable for controlling a timing for supplying a voltage of the first bit line to the first NMOS transistor and a timing for supplying a voltage of the second bit line to the second NMOS transistor in response to an assigned one of the first and second offset selection signals,
       wherein the first and second transistors include a first type transistor, and the third and fourth transistors include a second type transistor.

11. The semiconductor memory device of claim 10, wherein the offset supplier includes:
    a first coupler suitable for coupling the first bit line and the second end of the first transistor to each other in response to the first offset selection signal; and
    a second coupler suitable for coupling the second bit line and the second end of the second transistor to each other in response to the second offset selection signal.

12. The semiconductor memory device of claim 10, wherein when the mat enable signal corresponding to the upper cell mat is enabled, the offset controller enables the first offset selection signal, and when the sense amplification enable signal is enabled while the first offset selection signal is enabled, the offset controller enables the second offset selection signal, and
    when the mat enable signal corresponding to the lower cell mat is enabled, the offset controller enables the second offset selection signal, and when the sense amplification enable signal is enabled while the second offset selection signal is enabled, the offset controller enables the first offset selection signal.

13. The semiconductor memory device of claim 10, further comprising:
    a control signal generation unit suitable for generating the sense amplification enable signal in response to an active signal and a precharge signal, and generating a pull-up control signal and a pull-down control signal whose enabling moments are controlled based on the generated sense amplification enable signal; and
    a voltage driving unit suitable for supplying a driving voltage through the first power source line and the second power source line based on the pull-up control signal and the pull-down control signal.

14. The semiconductor memory device of claim 10, further comprising:
    a precharger suitable for grounding the first bit line and the second bit line with a ground voltage, when an equalizing signal is enabled.

15. A data sense amplification circuit that is coupled between first and second power source voltage terminals to sense and amplify a voltage difference between a first data line which transfers a data outputted from a first region and a second data line which transfers a data outputted from a second region, comprising:
- a first transistor coupled between the first power source voltage terminal and the first data line, having a gate receiving a signal of the second data line;
- a second transistor coupled between the first power source voltage terminal and the second data line, having a gate receiving a signal of the first data line;
- a third transistor coupled between the second power source voltage terminal and a first node, having a gate receiving a signal of the second data line;
- a fourth transistor coupled between the second power source voltage terminal and a second node, having a gate receiving a signal of the first data line; and
- an offset supplier suitable for controlling a timing for supplying a voltage of the first data line to the first node and a timing for supplying a voltage of the second data line to the second node according to a selected region from the first region and the second region.

16. The data sense amplification circuit of claim 15, wherein when the first region is selected, the offset supplier couples the first data line and the first node to each other and then after a voltage is supplied to the first power source voltage terminal and the second power source voltage terminal, the offset supplier couples the second data line and the second node to each other, and
when the second region is selected, the offset supplier couples the second data line and the second node to each other and then after the voltage is supplied to the first power source voltage terminal and the second power source voltage terminal, the offset supplier couples the first data line and the first node to each other.

17. The data sense amplification circuit of claim 15, further comprising:
- an offset controller suitable for generating a first offset selection signal and a second offset selection signal in response to a first region selection signal and a second region selection signal and deciding an order that the first offset selection signal and the second offset selection signal are enabled based on a timing that a voltage is supplied to the first power source voltage terminal and the second power source voltage terminal.

18. The data sense amplification circuit of claim 17, wherein the offset supplier includes:
- a first coupler suitable for coupling the first data line and the first node to each other in response to the first offset selection signal; and
- a second coupler suitable for coupling the second data line and the second node to each other in response to the second offset selection signal.

19. The data sense amplification circuit of claim 17, wherein when the first region selection signal is enabled, the offset controller enables the first offset selection signal, and when a voltage is supplied to the first power source voltage terminal and the second power source voltage terminal while the first offset selection signal is enabled, the offset controller enables the second offset selection signal, and
when the second region selection signal is enabled, the offset controller enables the second offset selection signal, and when a voltage is supplied to the first power source voltage terminal and the second power source voltage terminal while the second offset selection signal is enabled, the offset controller enables the first offset selection signal.

20. The data sense amplification circuit of claim 15, further comprising:
- a precharger suitable for grounding the first data line and the second data line with a ground voltage, when an equalizing signal is enabled.

* * * * *